United States Patent [19]

Sasaki et al.

[11] Patent Number: 5,422,856
[45] Date of Patent: Jun. 6, 1995

[54] NON-VOLATILE MEMORY PROGRAMMING AT ARBITRARY TIMING BASED ON CURRENT REQUIREMENTS

[75] Inventors: Toshio Sasaki, Mizuho; Toshihiro Tanaka, Akigawa; Masataka Kato, Musashino, all of Japan

[73] Assignee: Hitachi, Ltd., Tokyo, Japan

[21] Appl. No.: 203,303

[22] Filed: Mar. 1, 1994

[30] Foreign Application Priority Data

Mar. 4, 1993 [JP] Japan .................................. 5-043566

[51] Int. Cl.⁶ .............................................. G11C 8/00
[52] U.S. Cl. ........................... 365/230.03; 365/189.05; 365/218
[58] Field of Search ................... 365/230.03, 189.05, 365/218, 189.04, 195, 200

[56] References Cited

U.S. PATENT DOCUMENTS 4,899,310  2/1990  Baba .............................. 365/189.05
4,984,212  1/1991  Fukuda .......................... 365/230.03

FOREIGN PATENT DOCUMENTS

2-292798  12/1990  Japan .

*Primary Examiner*—Joseph A. Popek
*Assistant Examiner*—A. Zarabian
*Attorney, Agent, or Firm*—Fay, Sharpe, Beall, Fagan, Minnich & McKee

[57] ABSTRACT

To effect erase and program operations, i.e., rewrite of the non-volatile memory device efficiently with small electric power consumption and at high speed, a plurality of memory blocks that have a plurality of sectors and that each include a plurality of non-volatile memory cells are connected to buffer memories having at least the same memory capacity as a sector, and a read/write circuit generates internal addresses and timing for selecting sectors according to the external address and timing signals to control the read-out and rewrite of data between the sectors corresponding to the internal addresses and the buffer memories corresponding to the sectors, wherein the read/write circuit selects the sectors at timings shifted from one another and erases or programs the data in the selected sector in order to rewrite the data.

19 Claims, 11 Drawing Sheets

NON-VOLATILE MEMORY PROGRAMMING AT ARBITRARY TIMING BASED ON CURRENT REQUIREMENTS

BACKGROUND OF THE INVENTION

The present invention relates to an electrically erasable programmable read-only memory (EEPROM) in a semiconductor memory, and particularly to a non-volatile memory device suitable for high-speed erasure and programming.

Figure 2:
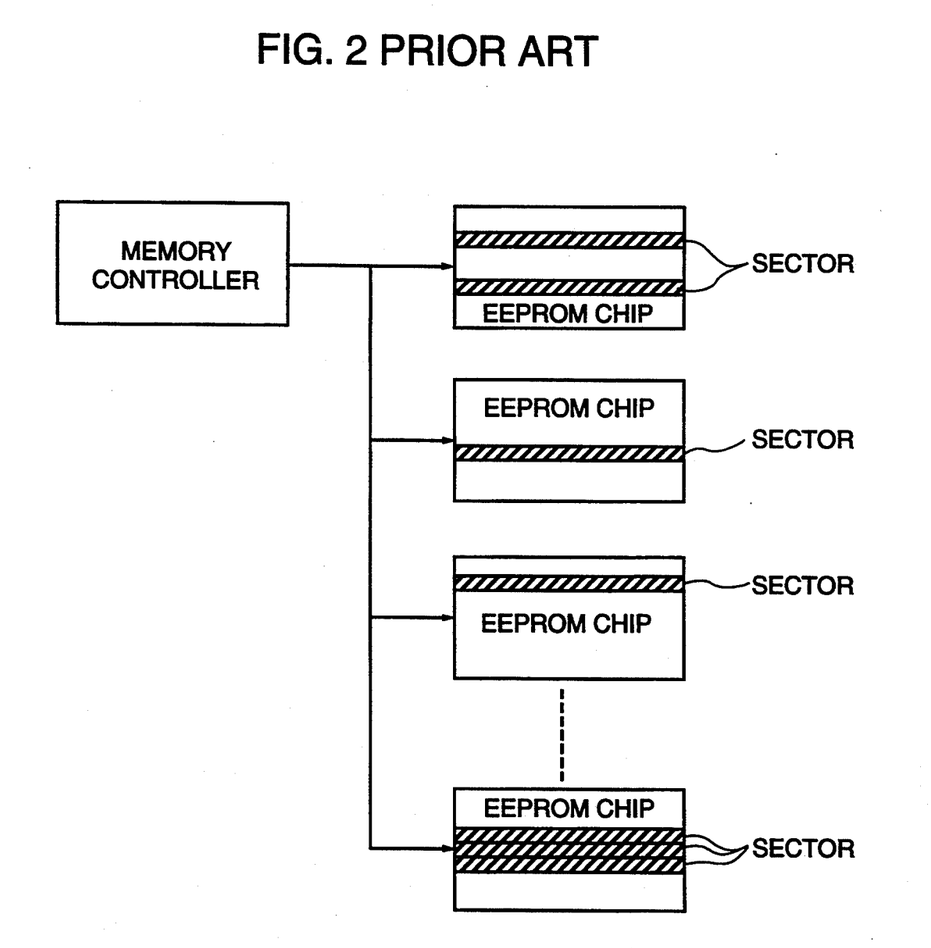
FIG. 2 is a block diagram illustrating a non-volatile memory device according to a prior art.

A conventional non-volatile memory that employs a data rewriting method using erasure and programming is shown in FIG. 2, which is a diagram in Japanese Patent Laid-Open No. 2-292798 corresponding to U.S. application Ser. No. 07/337,566 filed Apr. 13, 1989. An array of EEPROM cells on a chip constitutes a sector, and all of the cells included in a sector are erased simultaneously. This is, the device selects a combination of chips that are to be erased and partly erases them simultaneously. This device is therefore faster and more effective than past devices in which all of the cells of a chip are erased at one time, or a sector is erased at one time.

SUMMARY

It is an object of the present invention to analyze the prior art, identify and analyze causes for problems and to improve upon the prior art.

According to the above-mentioned prior art, a plurality of sectors extending in chips are simultaneously erased. Though the current required for erasing or programming varies depending upon the injection and emission phenomena of the non-volatile memory cell to the floating gate, the current due, for example, to the tunneling phenomena is about 10 nA per cell and is 10 $\mu$A when the number of cells simultaneously selected is 1K bits. When consideration is given to drive circuits such as the high-voltage power source for erasure or programming and the drive circuit for a CMOS logic circuit, the current is as great as several tens of mA and the total current is considerably greater when a plurality of chips in the whole device are simultaneously erased or programmed. Therefore, problems arouse in the prior art device, such as increased noise due to an increase in consumption of current and low reliability due to generation of heat. Simultaneously driving a plurality of sectors in a chip basically causes an increase in the number of cells that are to be erased, which is little different from driving one sector, and the current increases little compared with that of driving the sectors extending in a plurality of chips.

Another object of the present invention therefore is to erase and program the non-volatile memory (i.e., to perform a rewrite processing) efficiently at high speed with a small power consumption by dispersing with regard to time the current that flows during erasing or programming of the whole device.

BRIEF DESCRIPTION OF THE DRAWINGS

Further objects, features and advantages of the present invention will become more clear from the following detailed description of a preferred embodiment, shown in the accompanying drawing, wherein.

DETAILED DESCRIPTION OF THE DRAWINGS

Figure 1:
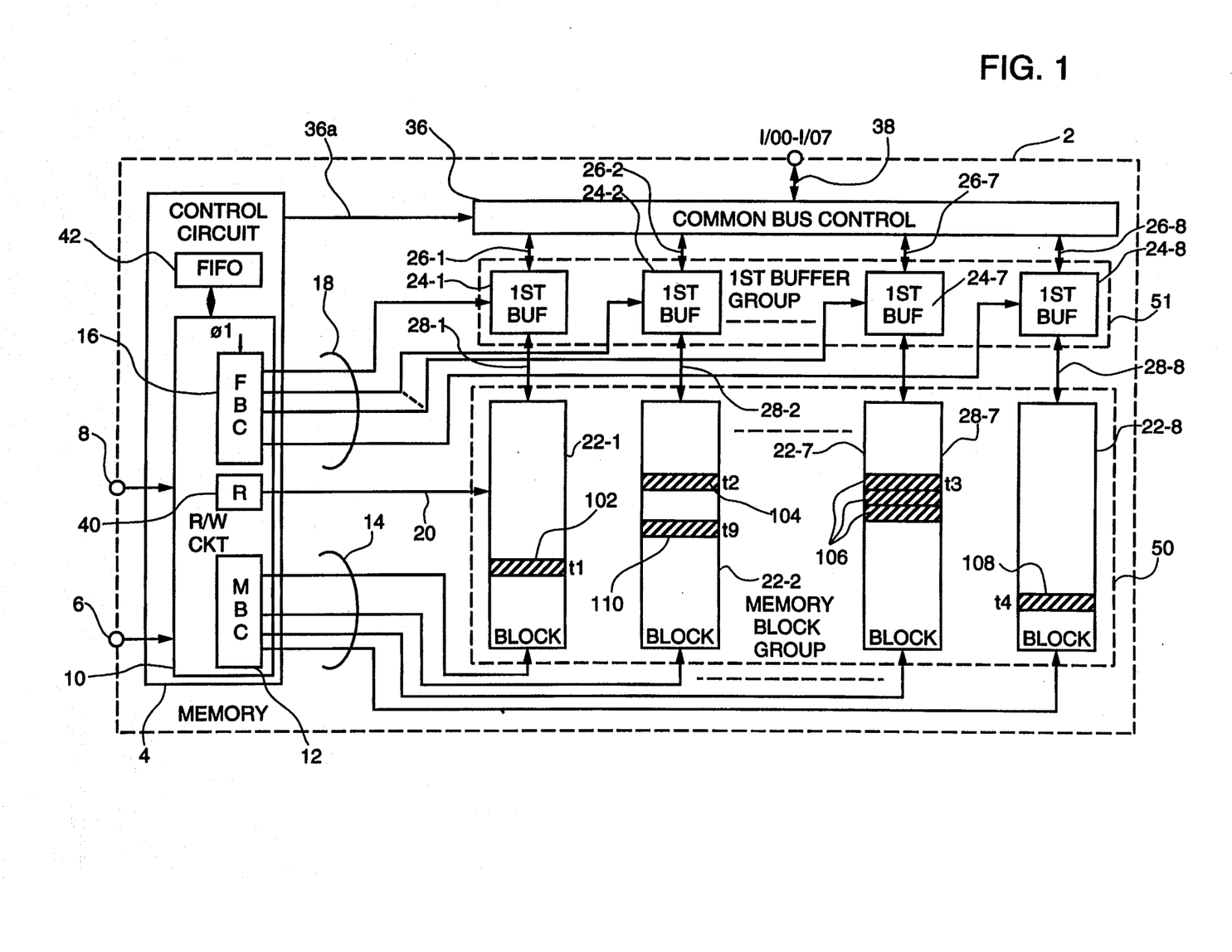
FIG. 1 is a block diagram which schematically illustrates erasing and programming of a non-volatile memory device of the present invention.

According to an embodiment of the present invention, the above-mentioned objects are accomplished in a way described below. For example, as shown in FIG. 1, first buffer memories, 1st BUF (24-1 to 24-8) each have a memory capacity at least equal to and preferably equal to the capacity of each of sectors 102, 104, 106 (three sectors), 108, 110, which sector capacity is a rewrite unit of data of the non-volatile memory 50. The first buffer memories are arranged between memory blocks (22-1 to 22-8) and the common bus control 36 that is connected through an external terminal (of the single circuit shown in dotted lines) to an external I/O signal 38, I/O0–I/O7. That is, memory cells of one of the first buffer memories and memory cells of a sector of the memory blocks correspond to each other one to one, and data is read out or programmed in via the first buffer memories. In order to erase and program, i.e. rewrite, the non-volatile memory 50, the activation or addressing of the individual sectors is controlled by selecting the sectors among the memory blocks at shifted timings, $t_1$ to $t_9$ for example.

Figure 7:
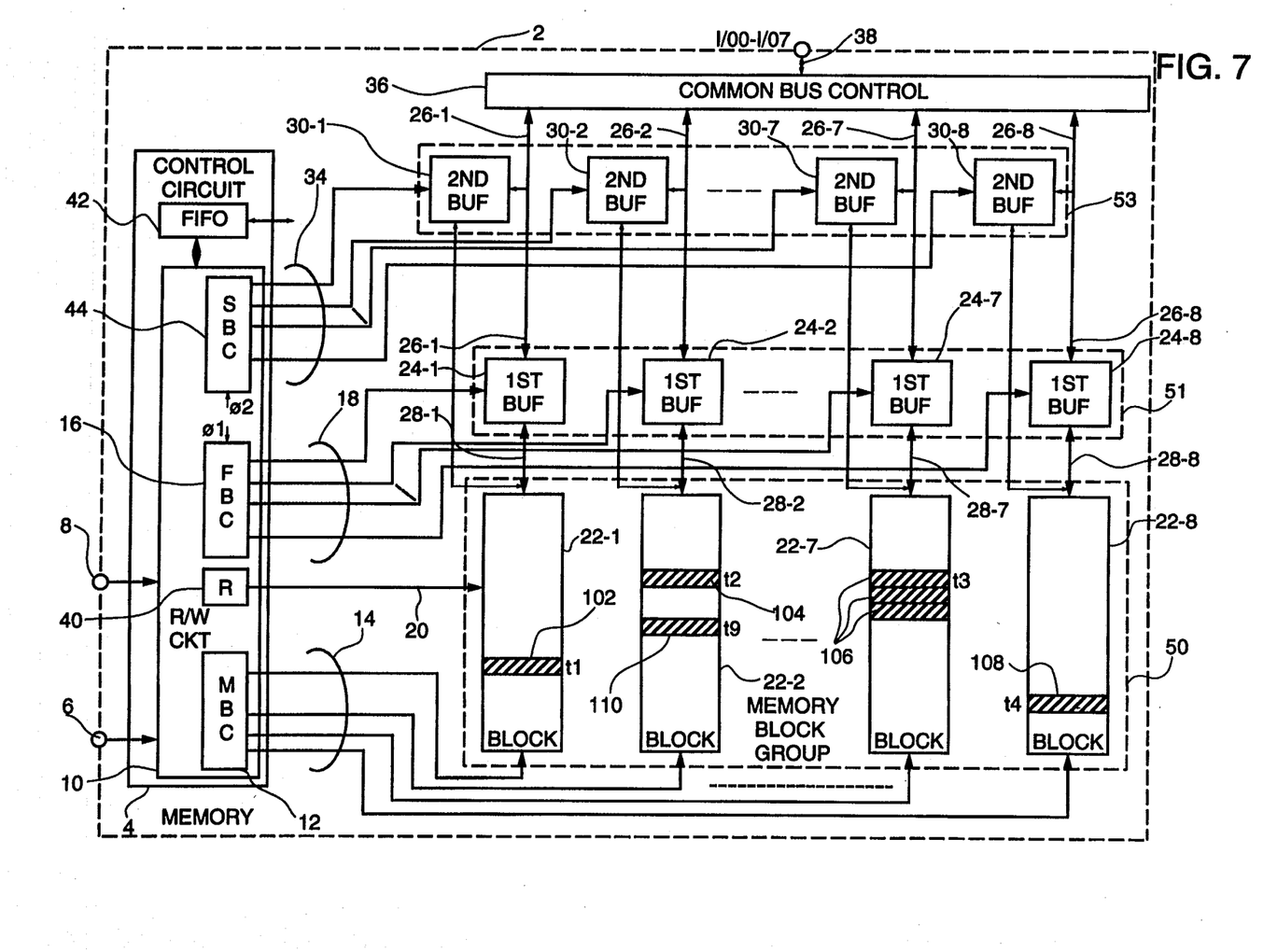
FIG. 7 is a block diagram for explaining the present invention.

According to FIG. 7, which may be considered as merely showing further structure of FIG. 1 or may be considered another embodiment of the present invention, for example, second buffer memories, 2nd BUF, (30-1 to 30-8) are arranged between first buffer memories (24-1 to 24-8) and the external I/O signal 38. This enables the data of two sectors to be transferred at one time, contributing to the effective efficiency of the programming and read out.

With respect to the control of sector selection at shifted timings $t_1$ to $t_9$ as mentioned above, the time required to do the erasing and programming varies from sector to sector depending upon the characteristics of individual sectors of the memory blocks. Therefore, a minimum shifting time is determined from the number of the memory blocks that can each have one or more sectors be simultaneously selected in parallel and thereby activated, taking a maximum allowable current of the memory device 2 into consideration.

As described above, the erasing and programming (i.e. rewriting operation) of the non-volatile memory devices of the present invention are optimally controlled and carried out at high speed.

The rewriting of data is effected by selecting the sectors at shifted timings $t_1$ to $t_9$ among the sectors of the individual memory blocks (22-1 to 22-8). In this case, upon receipt of an external address 8, the memory device 2 judges whether or not a sector corresponding to the external address can be erased with the current operation mode. When it is judged that the sector can be erased, then the sector is actually erased. When there are a number of sectors (previously and newly addressed) to be rewritten and the sectors cannot be rewritten by simultaneous parallel rewriting because the total current would exceed a maximum allowable current of the memory device, the operation is temporarily halted until the rewrite of the previously addressed sectors is completed. After the completion of the rewrite of at least some of the previously addressed sectors, the rewrite of the newly addressed sector/s is carried out. The programming is carried out following the erasing of the sector as long as the number of the memory blocks is within a current range in which the memory blocks can be rewritten simultaneously in parallel. When the number of blocks exceed the current range, the programming is halted and later resumed in accordance with the order of addresses that are input. The individual sectors of the memory blocks are selected at shifted timings, to be erased and programmed, suppressing the peak current and reducing the total time taken to rewrite.

The first buffer memories (24-1 to 24-8) and the second buffer memories (30-1 to 30-8), make it possible to transfer the data of two sectors of a single block at one time, e.g. transferring programming data from the common bus control 36 to second buffer 30-2 in parallel with transferring programming data from first buffer 24-2 to a predetermined sector of block 22-2. Furthermore, while a first buffer memory (e.g. 24-7) is programming data by transferring its content to a predetermined sector, the second buffer memory (e.g. 30-7) of the same block (e.g. 22-7) can have data read out during this programming. Therefore, by selecting the sectors among the memory blocks (22-1 to 22-8) at shifted timings and by efficiently controlling the two buffer memories for each block, free time that has existed in the past can be effectively utilized to further increase the operation speed.

Memory blocks 22-1 to 22-8 constitute electrically programmable non-volatile memories, which store data in the form of a memory board, memory card or memory module. A device read/write control circuit 4 controls the read out or the rewrite, (i.e., reading or erasing and programming) of the memory blocks 22-1 to 22-8 of the memory device 2. One or more external timing signals, such as a clock or memory control signal/s 6, such as a read/write control signal, is sent from, for example, a microcomputer or the like (not shown). Read/write circuit (R/W CKT) 10 generates internal addresses of the memory blocks 22-1 to 22-8 based upon the external address signal 8 and the external memory control signal/s 6, and thereby controls read out and rewrite. An address register (R) 40 stores an internal address that selects a memory block and a sector. Internal address signal 20 is fed to the memory blocks 22-1 to 22-8. Memory block control circuit (MBC) 12 controls the memory blocks 22-1 to 22-8 separately by outputting memory block control signal 14.

First memory buffer group 51 consists of first buffer memories 24-1 to 24-8. When the data is programmed into the memory blocks 22-1 to 22-8 of the memory block group 50, the first buffer memories 24-1 to 24-8 of the first memory buffer group 51 temporarily hold the data until programmed data of 4K bits is obtained in one of the first buffer memories, if one sector has a 512 byte capacity (8 bits/byte×512 bytes=4K bits). The buffer memories serve as a programming data storage area when the rewrite of the sectors of the memory blocks is shifted in time. The total capacity of the first buffer memories of FIG. 1 is 32K bits (8 first buffer memories×4K bits per first buffer memories). First buffer control circuit (FBC) 16 controls the first buffer memories 24-1 to 24-8 with control signal 18, and second buffer control circuit (SBC) 44 controls the second buffer memories 30-1 to 30-8 with control signal 34.

Lines 26-1 to 26-8 are internal I/O buses, and lines 28-1 to 28-8 are data buses between the memory blocks and the first buffer memories. The common bus control 36 is controlled by the control signal 36a from the control circuit 4 so that the common bus control connects the external I/O signal 38 to the internal I/O buses 26-1 to 26-8. The timings t1 to t4 and t9 denote times at which the respective sectors are activated, i.e., showing that the sectors are activated at predetermined times or at random times. An activating signal $\phi_1$ or $\phi_2$ of the control circuit 16 or 44 activates the control signal 18 or 34 for the first or second buffer memories 24-1 to 24-8 or 30-1 to 30-8 and determines the operation timings thereof. When the outputs of the first buffer memories 24-1 to 24-8 are changed into a tri-state with the control signal 18, the internal I/O common buses 26-1 to 26-8 may be directly connected to the external I/O signal 38, and the common bus control unit 36 may be omitted.

The erasing and programming are data rewrite of the memory device 2 of the embodiment. The rewrite is carried out by first erasing the content of the memory cells of the addressed sector/s, and then successively programming the data of the appropriate one/s of the first buffer memories 24-1 to 24-8 into the just erased memory cells of the addressed sector/s respectively. This programming involves injecting electrons or holes into the floating gate of each of the memory cells and requires a high voltage. The time that the high voltage is applied for the programming is longer than the read-out time. Therefore, the difference between the read-out time and the programming time is of two or three orders. This long programming time is a problem of the non-volatile memory of the memory device when in use. In this embodiment, the shifted-timing rewrite-operation is carried out so that while some sectors are being erased other sectors are successively programmed (parallel erasing and programming) unlike conventional series rewrite-operations. The present invention parallel operation is in contrast to the above-mentioned prior art wherein a series of erasings and programmings are successively effected for each of the sectors, for a method in which a plurality of sectors of a plurality of chips are erased at one time, after which the programming is effected.

In FIG. 1 the erase/program is carried out for one sector at t1, t2, t9 or t4, or successively for several sectors starting at t3 of the address memory blocks at one time. The numbers of times t1 to t4 and t9 denote the order of times at which the sectors are rewritten after the addressed sectors have been erased.

When the rewriting is carried out by a conventional method, the rewriting time required is a time corresponding to the times the sectors are serially rewrite. In this embodiment, however, a plurality of sectors are selected at shifted timings and parallel rewritten in a predetermined time. By this method, a plurality of sectors to be rewritten are provided in advance with the receipt of external addresses in register 42, then the read/write circuit 10 converts these external addresses into internal sector addresses and stores in the address register 40 the internal sector addresses related to these external addresses, and the sectors are erased at shifted timings. The sectors are then successively programmed at shifted times. In this case, the timings are such that the data input to the first buffer memories 24-1 to 24-8 together with external addresses on line 8 (step 100 of FIG. 9) are sent out to the blocks 22-1 to 22-8 at expanded and relatively shifted timings in synchronism with the erasing and programming timings of the control signals 18, 20, 14, 36a with respect to the memory blocks 22-1 to 22-8. Further, since selection of the sectors except the predetermined sectors in the address register 40 is inhibited, a FIFO register 42 for storing the next addresses to be executed is provided. This FIFO register makes it possible to store the next addresses of the sectors to be rewritten next and, hence, to reduce the processing time of the erasing and programming. In the address register 40, there is at least a flag bit for each address to determine shifted timings and to distinguish the internal address being executed from the internal address that is to be executed. Further the flag bit can be used in step 110 of FIG. 9 with the addresses of the sectors held in the address register 40 that are being programmed or erased, and it can be judged whether or not the sectors are completely erased or rewritten. It may further be used as a signal for inhibiting the erasing or programming access to sectors other than the subject sector. The programming can be controlled sequentially by an erasure or program completion signal from the memory blocks 22-1 to 22-8 or by the read/write circuit 10 itself.

Figure 9:
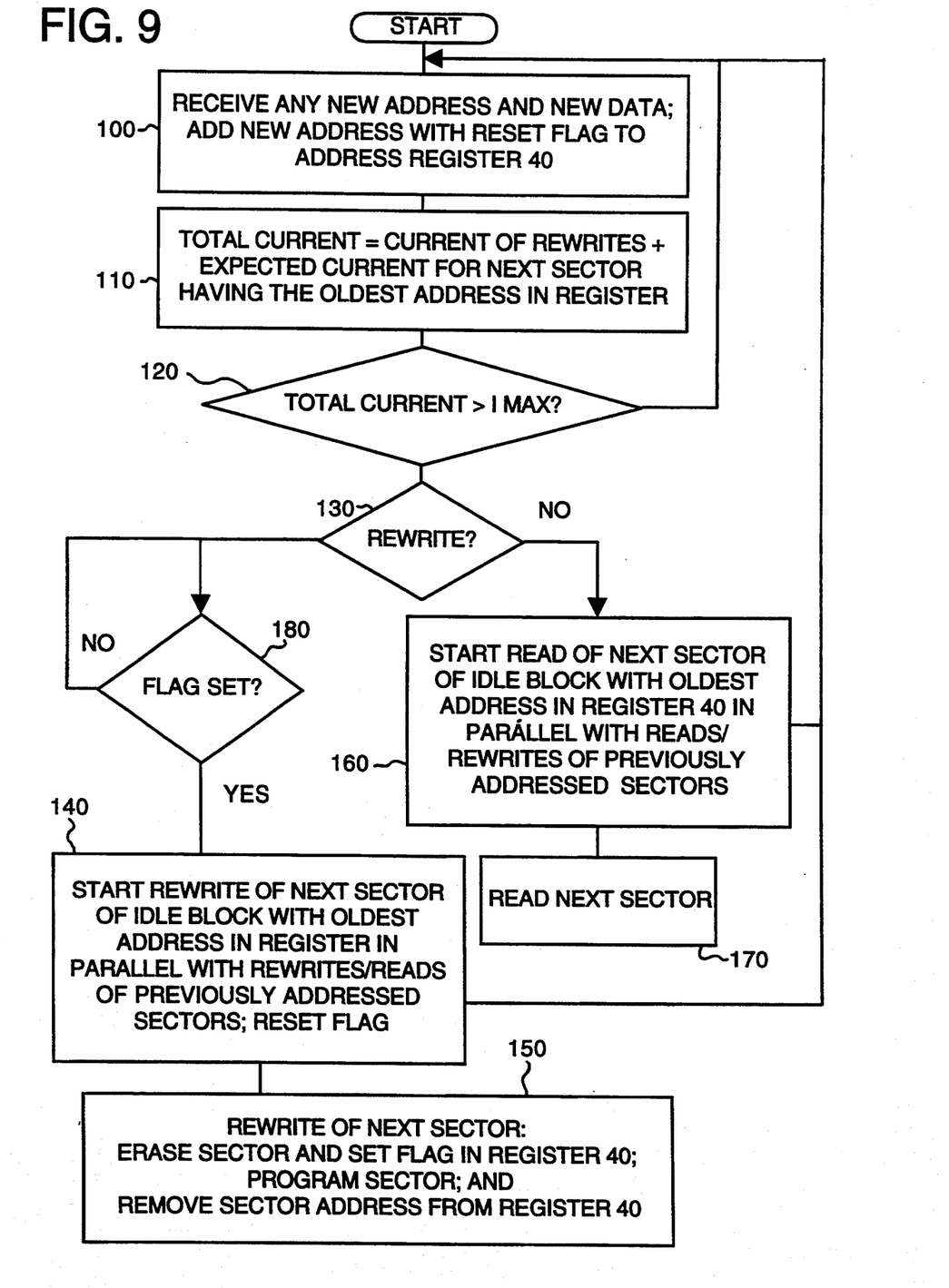
FIG. 9 is a flow chart of operation of the read/rewrite circuit.

Concretely, as shown in FIG. 9 upon the input of an external address 8, step 100, it is judged in step 110 whether or not the sector corresponding to the external address 8 can be erased immediately according to whether the number of sectors being erased and/or programmed is too large, i.e. the total current for the simultaneous parallel rewriting (erasing and programming) exceeds a present allowable current, I MAX of the device 2. Accordingly when YES the erasing of the sector corresponding to the address being processed is not allowed and the operation is temporarily suspended until the previously started rewrite of some of the other sectors is finished by returning to step 110 repeatedly until the answer is NO, and then step 120 is performed to erase the sector addressed. The programming of the concerned sectors is executed after the erasing. The number of sectors to be rewritten simultaneously and parallely is limited by the current in step 110. Therefore, when the number of the sectors exceeds the limit, the program-operation is suspended in accordance with the order of the addresses that are input. As described above, the non-volatile memory device 2 selects the sectors of the memory blocks at shifted timings to control the erasing and programming. Therefore, the current consumption is suppressed from increasing uncontrolled and the rewriting time is shortened. The flag bit is referred to and updated as a management bit of the rewrite.

Figure 10:
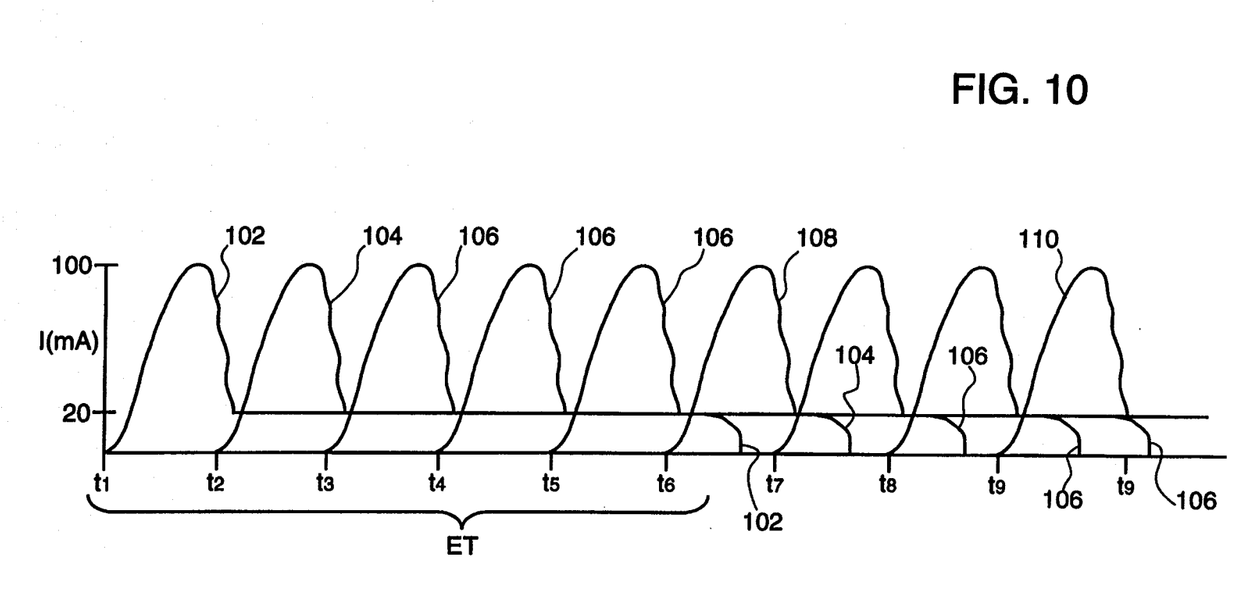
FIG. 10 is a waveform diagram of rewrite current for different sectors.

The sector addressing control based upon the shifted-timing selection is carried out under the condition that the current for rewriting (i.e., erasing and programming) is in an allowable range of current (determined in step 110) when a plurality of non-volatile memory blocks are operated parallely as judged by step 120. That is, the high-speed operation of the device is accomplished by the optimal frequency of parallel rewrites such that the total current of non-volatile memory blocks is below the maximum limit. The total current is mainly for starting the high-volatile circuitry, for rewriting the memory blocks, for charging and discharging of erasing and rewriting circuitry, and for starting the CMOS logic circuits. Therefore the rewrite control at shifted timings avoids the peak currents flowing simultaneously (FIG. 10). For memory blocks through which large current flows in certain periods in the erasing and through which currents of low levels flows in the other periods of the operations, the number of memory blocks simultaneously activated can be increased by avoiding the periods in which the large currents flow as seen in FIG. 10.

For instance as seen in FIG. 10, assume that the allowable total current of the device is 200 mA, the peak current to erase is 100 mA (e.g. occurring for only about 15% of the total erasing time ET) for only one sector (any one of sectors 102, 104, 106, 108, 110) and the steady erasing current is 20 mA (e.g. occurring for 85% of the total erasing time) for only one sector. In this case, the peak current when a sector 108 of a memory block is selected for erasing shortly after t6 is 100 mA and the steady erasing current for five sectors 102, 104, 106, 106, 106, is 100 mA because of the shifted-timing selection (start of erasing is shifted by about 15% of the total erasing time ET between sectors). Therefore, six memory blocks can be parallel erased by the above operation (one drawing peak current and five drawing steady current). Furthermore, when the erasing and the programming do not consume nearly the same amount of current, i.e., when, for example, the programming consumes a larger current, the number of memory blocks to be activated for programming is more limited than the number activated for erasing. When the times required to erase and program the sector are different from each other, shifted-timing erasing and programming, i.e., rewrite, is carried out under the condition that the activation total current is in the allowable range and the number of block memories to be parallely rewritten is the optimal number or less. Furthermore, a minimum shift time is calculated based on the number of memory blocks simultaneously and parallely selected and activated, and is determined taking into consideration the maximum allowable current of the device.

In the above-mentioned prior art device, the rewriting speed of each of the memory blocks will be calculated on the assumptions that in the erasing and programming operations the sector is of 512 bytes, the erasing time of one sector is 10 ms, the programming time is 5 $\mu$s/byte, there are eight first buffer memories, and all the first buffer memories are always accessed every time. By this conventional method, the rewrite speed of the non-volatile memory is about 12.56 ms per sector (=10 ms+5 $\mu$s×512).

In the shifted-timing rewrite-operation of this embodiment, if four memories are erased under a steady current state at timings shifted to such a degree that the peak currents are prevented from flowing simultaneously, the average rewrite speed is about 5 ms/sector (=(10 ms×8/4+5 $\mu$s×512×8)/8) which is more than twice as fast as the conventional memory. The speed can be further increased in devices in which more buffer memories are provided. In programming the same sector, the data may exist in the corresponding first buffer memory, and hence the frequency of rewrites (i.e., erasings and programmings) can be decreased. On the other hand, the addresses of the sectors erased and programmed may be temporarily held by the address register 40 and the erasing and programming may be executed asynchronously with the external address, or the external address 8 itself may be used as an internal address 20 and may be supplied to the memory blocks at the timing relatively shifted from the timings where the external address 8 is supplied.

As for another role of the buffer memories, even when external addresses are input and data are similarly input, their processing can be done in order by the address storage in the FIFO register 42 and the address register 40 and by the data buffering of the first buffer memories 24-1 to 24-8, and the rewrite can be executed at a speed independent of input timing. As described above, the capacity of the first and second buffer memories can be the same as that of the sectors of the memory blocks. When a lot of external addresses and data are input in advance for the rewrite, the following are taken into consideration: the increase of the capacities of address registers, and the buffer memories capacity and control. In rewriting the memory cells of the non-volatile memory, use of a data latch circuit having the same capacity as that of the sectors may be needed in order to program the memory cells for each of the sectors and to confirm the completion of the programming, i.e., to verify the programming. In this case, the shifted timing selection for rewriting may be effected using a combination of the data latch circuit and the first buffer memories as the first buffer memory or using the data latch circuit itself as the first buffer memory.

Data stored in the sectors of the memory blocks not being rewritten can be read out in parallel with rewriting of other blocks. Page access to the content of one sector can, at the same time, be held in the buffer memory and sequential output can be performed in addition to read-out of each byte which is an ordinary address access. During the rewrite-operation, programming and reading may be effected simultaneously by rewriting the sector of the memory block based on the programming data of the corresponding first buffer memory while reading the sectors of other memory blocks. In controlling such programming and reading, the read data of a cell written in the first buffer memory can be transferred at a high speed as in ordinary memories, and consequently the read-operation need not wait a long time for completion of the rewrite-operation. When the rewrite and readout are simultaneously (parallely) carried out, the number of memory blocks to be activated is controlled like the rewrite-operation in view of the increase in current during parallel rewrite and read out processing. It is apparent that the first buffer memory functions as a cache memory for programming or reading the memory block by holding the data before programmed or after updated.

Figure 3:
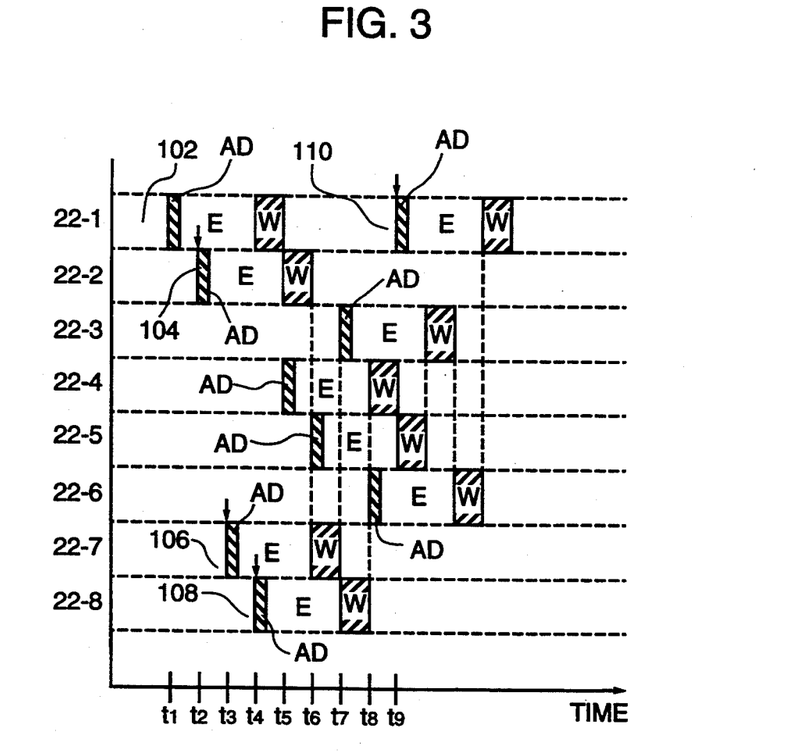
FIG. 3 is a time sequence for explaining the present invention.

In FIG. 3, the period AD is for transfer of addresses and for transfer of programming data, E denotes the period to erase the sector of the corresponding memory block, and W denotes the write-operation period (programming). FIG. 3 shows time sequences that the operations of the sectors of the memory blocks 22-1 to 22-8 of the non-volatile memory device 2 are shifted to the operations of erasing E and programming W with the passage of the time t during the rewrite, and corresponding in timing to FIG. 9. The timing of rewriting the data according to the present invention will be described with reference to FIGS. 1, 3 and 9.

Starting at time t1, the sector 102 of the memory block 22-1 is addressed for period AD and erased for period E, and then the content of the buffer memory 24-1 is written (programming) in period W into the sector 102 (one iteration of steps 100–150 of FIG. 9. The sector 104 of the memory block 22-2 corresponding to the buffer memory 24-2, starting at time t2, is addressed in period AD and erased in period E, which time t2 is shifted from time t1 by a fixed delay of at least ΔT of step 1, which ΔT is preferably set to equal the period of time W, so that programming periods W of different sectors will not overlap, and then written in period W, for a second iteration of steps 100–150. Similar operations are performed for other memory blocks 22-3 to 22-8, and each of the write-operations in periods W is effected without overlap with other write-operations of the other sectors of different memory blocks, because of step 180 and as shown by dotted vertical lines in FIG. 3. The erase times E and write times W of the sectors occur at different times from one another. The flag bit added to the address register 40 described with reference to FIG. 1 is set in step 150 upon the completion of the peak current portion of the write of period W for each of the sectors as seen in FIG. 10, and then this set bit enables the programming of period W of the next sector to start, which starting then resets the bit to provide the above mentioned delay ΔT. By the above rewrite, steps 130–150, 180, current concentration caused by the simultaneous (parallel) writing and erasing of a plurality of sectors during the programming can be alleviated by dispersion (overlapping of periods E and W), and hence the rewrite-operation can be effected at a high speed. Further the delay ΔT is variable, depending upon the speed of individual cells and circuits, for different sectors to obtain maximum speed.

Figure 4:
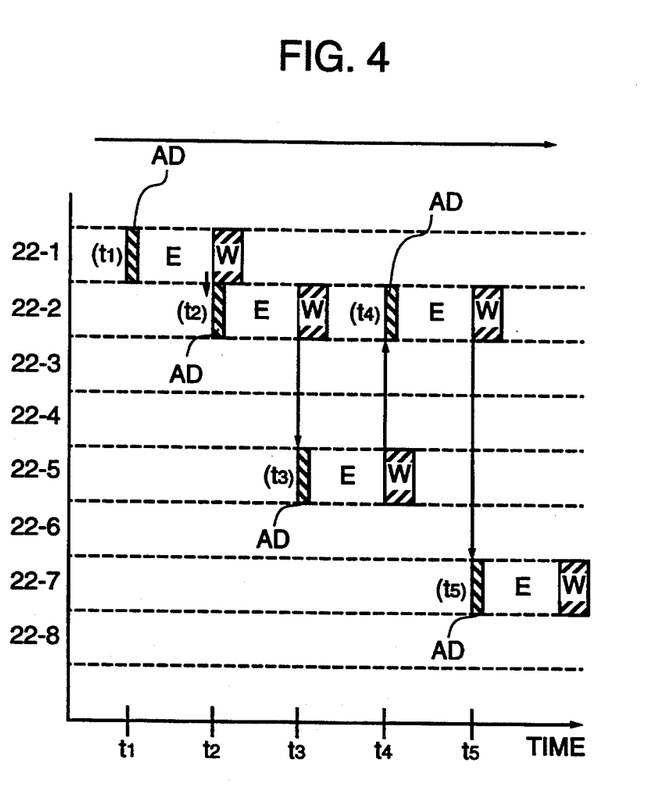
FIG. 4 is a time sequence for explaining the present invention.

FIG. 4 illustrates the time sequence of another mode of operating the FIG. 1 device.

In FIG. 4, the sector 102, of the memory block 22-1 is addressed at period AD and erased at period E, starting at predetermined time t1, and the sector 104 of the next memory block 22-2 begins to be erased for period E at a time t2 shifted from the time t1 by the full erase time of the sector 102 of the memory block 22-1 (such shifting, ΔT, is arbitrary with respect to the difference in timing of receiving the corresponding external addresses). The flag bit added to the register 40 is set upon the completion of the current erasure in step 150 as the sector current of FIG. 4 and as the peak current of FIG. 10 falls for FIG. 3. The setting of the address in the memory array (conventionally decoding an internal address and sending to the array) at the end of period AD enables the start of the erasure of the next sector, which starting resets the flag bit in step 140. Therefore, the programming in period W of the previously activated sector 102 overlaps with the erasure in period E of the next sector 104 for the timing of FIG. 4. Moreover, the rewrite address and rewrite data are stored in the address register 40 and in the first buffer memory 24-1, respectively for sector 102. When the programming time W becomes long due to characteristics involving a specific sector, the control is such as not to overlap with the programming period W of the next sector in the operation of FIG. 3. On the other hand, the erasure period E is always effected for one or more sectors in one memory block. This has an advantage in the cases where a large current flows at the time of erasing the memory block, so that at least a parallel operation of erasure period E and programming period W can be carried out, but simultaneous (parallel) erasings are prevented, which makes it possible to effect the rewrite operation faster than with conventional methods.

Figure 5:
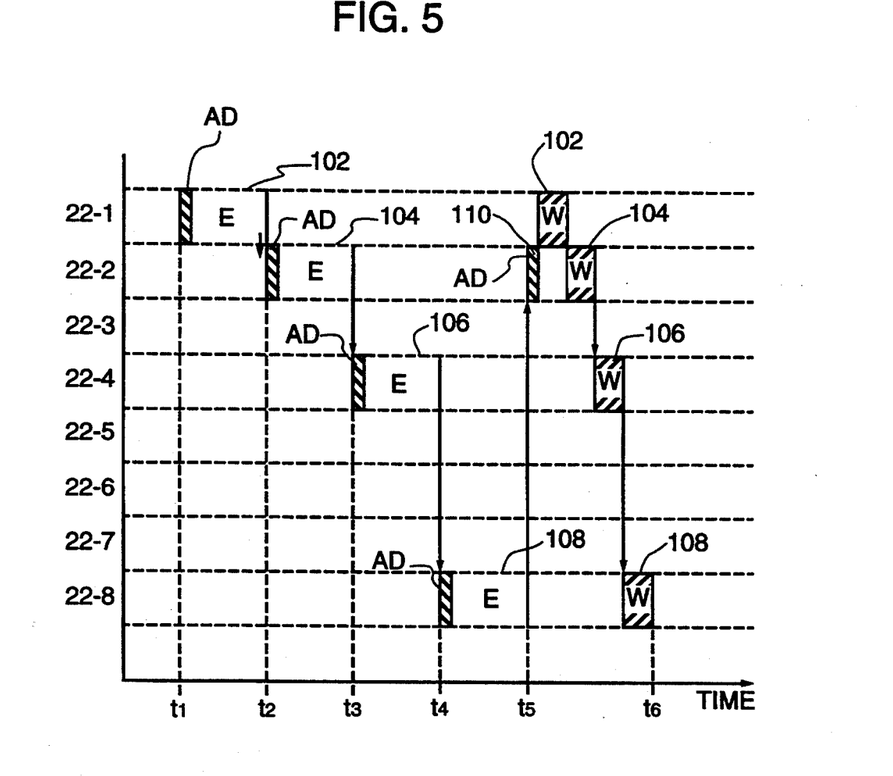
FIG. 5 is a time sequence for explaining the present invention.

When the rewrite-operation is requested in the memory device 2 another timing mode may be employed as shown in FIG. 5. The first addressed sector 102 of the memory block 22-1 is first addressed and erased starting at time t. This rewriting of sectors 102, 104, 106, 108 etc. is controlled by a corresponding plurality of rewrite-addresses stored in the address register 40 and corresponding data stored in the first buffer memories 24-1 to 24-8. The rewriting is started for each sector at respective times t1, t2, t3, t4, t5 based upon the flag bit that is in the address register 40 for each address. All the erasures can be sequentially effected within a predetermined number of sets of the flag bits of the address register 40. Then after the predetermined number of erasures has been reached, the device effects the programming operations. Therefore, the number of times of alternating between an erase and a program decreases in the device, and the switching of power sources, i.e., set up and set down of power sources necessary for the erasing and programming, is effected only once for all erasing and programming of the predetermined number of sectors. FIG. 5 illustrates an example of rewriting five sectors (i.e. the predetermined number of sectors), in which the memory block 22-1 is addressed and erased starting at time t1, and then the memory blocks 22-2, 22-4, and 22-8 are addressed and erased in this order; and then memory block 22-2 is selected again. Here, when an instruction for erasing the memory block 22-2, selects the memory block 22-2 again at time t5, the memory block 22-2 has already been erased in the time period t2–t3. That is, erasing has been completed referring to the erase flag bit related to the erasure, but the programming has not yet been effected by referring to a separate write flag bit that is related to the programming for each of sector 102, 104, 106, 108. At time t5, sector 110 is addressed in period AD, but the erasing of sector 110 is not effected, and instead the programming of sectors 102, 104, 106, 108 is effected in the memory blocks 22-1, 22-4, 22-8. Though there are five sectors 102, 104, etc. of t1, t2, etc. erased, the erasing of the sector 110 at time t5 is ignored and instead the programming of sectors 102,104, 106, 108 of four blocks is performed. Only the content of the second buffer memory 30-2 corresponding to the memory block 22-2 is replaced with the data input for sector 110 at time t5. Then, the programming of the four blocks is effected using the first buffer memories, until t6. At this moment of t6, the memory block 22-2 can be programmed for sector 110 by transferring data from second buffer memory 30-2 to first buffer memory (prior to t6), and then at t6 transferring the data from the first buffer memory 24-2 to sector 110 at the second timing as shown in FIG. 5. According to the above time sequence, the power source is set up or set down only once during the erasing (t1 to t5), and the programming (t5 to t6). Therefore, the time to do the rewrite (t1 to t6) can be shortened compared with when the paired erasing and writing was performed as shown in FIGS. 3 and 4. Furthermore, the data of a specific sector (e.g. 102) can be easily corrected (even after erasing, in time t2–t5, e.g.) by correcting the content of the buffer memory (e.g. 24-1) as long as the programming has not yet been effected for the sector (102). In this method, the erasings of the sectors do not overlap with one another.

Figure 11:
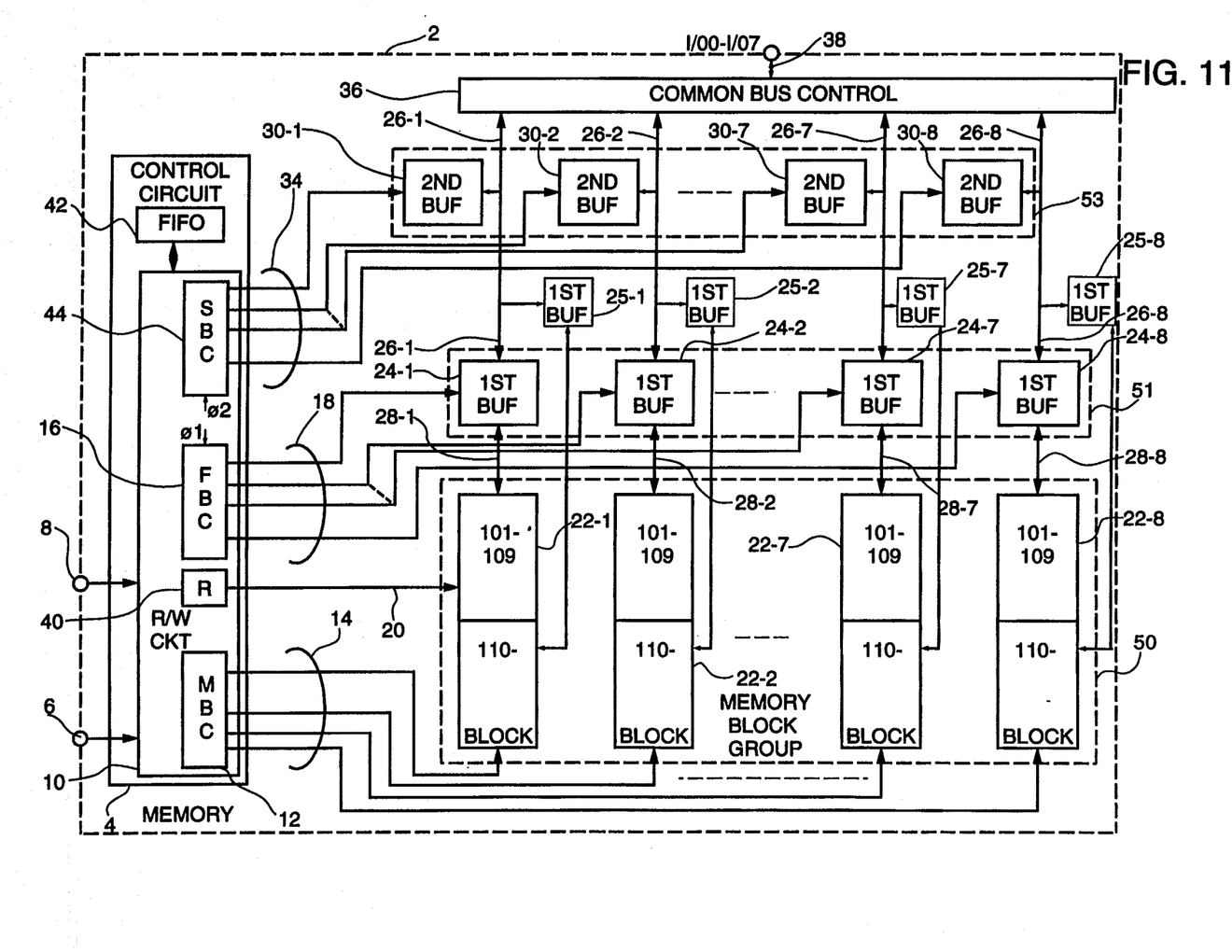
FIG. 11 is a block diagram for explaining the present invention.

As seen from the embodiment of FIG. 3, however, the erasing of a plurality of non-volatile memory blocks (a plurality of iterations of steps 130–150) is effected if the total current of the non-volatile memory blocks is within an allowable range as determined by step 120. This holds true for the programming. In the continuous erasing and programming of the different sectors (e.g. 104 and 110) in the same memory block (e.g. 22-2 of FIG. 5), a plurality of buffer memories are required in parallel (shown in FIG. 11) for the memory block. As seen in FIG. 5 one memory buffer 24-2 would hold data for sector 104 and involve addressing at t2 to operate effectively in parallel with another memory buffer 31-2 addressed at t5 and connected to sector 110 but not sector 104. Therefore, a plurality of address registers are prepared, in parallel to constitutes pairs of first memory buffers with the memory blocks.

Figure 6:
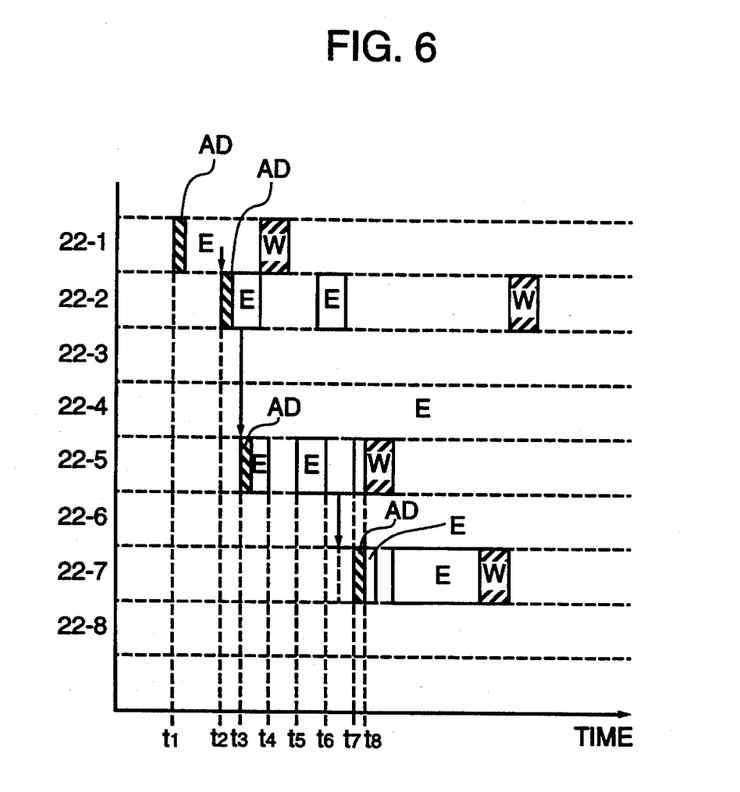
FIG. 6 is a time sequence for explaining the present invention.

FIG. 6 illustrates another time sequence of operating the illustrated devices. In FIG. 6, the same portions as those of FIGS. 1 and 3 are denoted by the same reference numerals and will not be described. The timing at which the data is rewritten according to the present invention will now be described with reference to FIGS. 1 and 6.

FIG. 6 illustrates the case where the erasing time period E is divided for at least some sectors. In this case the current of the device increases during the programming period W. Therefore, the device functions so that when one sector is being programmed (e.g. during period W for block 22-1), the other sectors are inhibited. This is, while the sector is programmed, other sectors are inhibited from being erased and programmed, and the times necessary for erasing the sector are divided into short times. For example, the sector of the memory block 22-5 is accessed in the following sequence: addressing for period AD and erasing for period E (t3 to t4), free time in non-activated state (t4 to t5), continued erasing in period E (t5 to t6), free time (t6 to t7). In such a way erasing is repeatedly performed for one sector until completed. When the current of the device increases during the erasure period E, on the other hand, the erasing of other sectors is prevented and the programming is executed. This embodiment suppresses the total current of the memory device 2 and enables the device as a whole to effect the rewrite at an increased speed.

In FIG. 7, the same portions as those of FIG. 1 are denoted by the same reference numerals and will not be described. In addition there are second buffer memories 30-1 to 30-8 as a second buffer memory group 53, a control signal 34 for the second buffer memories, a control circuit SBC 44 for the second buffer memories, and an activation enable signal $\phi 2$ for the second buffer memory control circuit 44. The rewrite will now be described for FIG. 7. The fundamental operation is the same as that of FIG. 1, and the addition of the second buffer memories 30-1 to 30-8 makes it possible to perform the additional operation described below. The transfer of the programming data between the first buffer memories 24-1 to 24-8 and the I/O signal 38 requires a time generally very much shorter than the time required for the rewriting, and therefore there exist considerably long non-activated periods or unused free times from the point of view of the common bus control 36. Utilization of this free time with the present invention makes it possible to effectively increase the rewrite and read-out efficiency. For instance, since there are two buffer memories for each block, the data of two sectors can be transferred at one time (in parallel, e.g.) while transferring the programming data to a predetermined sector. Furthermore, while one of the buffer memories is transferring data to a predetermined sector and thereby programming the sector, the other buffer memory for the same block can read in data from I/O signal 38. Therefore, the idle time can be efficiently utilized by accessing the sectors among the memory blocks (22-1 to 22-8) at shifted timings and by efficiently controlling the two buffer memories. Therefore the rewrite-operation can be effected at a further increased speed since part of it overlaps with a data input (operating in parallel). The first buffer memories 24-1 to 24-8 are chiefly used during the rewrite-operation, the second buffer memories 30-1 to 30-8 are utilized only for the read-in from I/O signal 38 and subsequent read-out to the first buffer memories 24-1 to 24-8. The first and second buffer memories are used for programming the sector and for reading the sectors of other memory blocks. If only the read-operation is performed, the data are alternately taken in by the first and second buffer memories for a block and are alternately read out, so that the reading time can be effectively shortened.

When the same sector is accessed for rewrite during a previously started rewrite, the first and second buffer memories are alternately activated to store the current rewrite programming data in the first buffer memory and to store the next rewrite programming data in the second buffer memory temporarily. After the data of the first buffer memory are written to the sector for programming, the next programming data are transferred from the second buffer memory to the first buffer memory to continue the rewrite.

The address register 40 for storing the internal address can be increased as required and controlled in correspondence with the buffer memories of the various systems described. The first and the second buffer memories may be constituted in parallel with the memory blocks and I/O (36, 38) as shown in FIG. 7. In this case, the first and the second buffer memories are used equally, and it can be taken that the capacities of the buffer memories are twice as large as the capacity of a sector of the memory block, or one of them can be used exclusively for programming and the other may be used exclusively for read-out.

The first buffer memories and the second buffer memories are efficiently controlled with regard to time to perform the rewrite, and hence parallel operations can be performed and/or the free times are utilized, contributing to increasing the operation speed of the device. In the parallel read-out and rewrite processing, furthermore, the two buffer memories are alternately used and tri stated to avoid the collision of data to be written in the same sector or to update the data of the buffer memories. Here, as the first buffer memories, the usual data line latch circuits provided in the memory blocks to supply data at one time to the cells during the rewrite of the sectors of the memory blocks can be used. In this case, the programming data of the data latch circuit is held in the memory blocks when the rewriting is finished or is changed. In the rewrite in which the output data changes, therefore, the data are read again from the memory cells after the rewriting has been finished. It is also allowable to store the programming data in both the first and the second buffer memories and to use the contents of the second buffer memories for reading the data.

Figure 8:
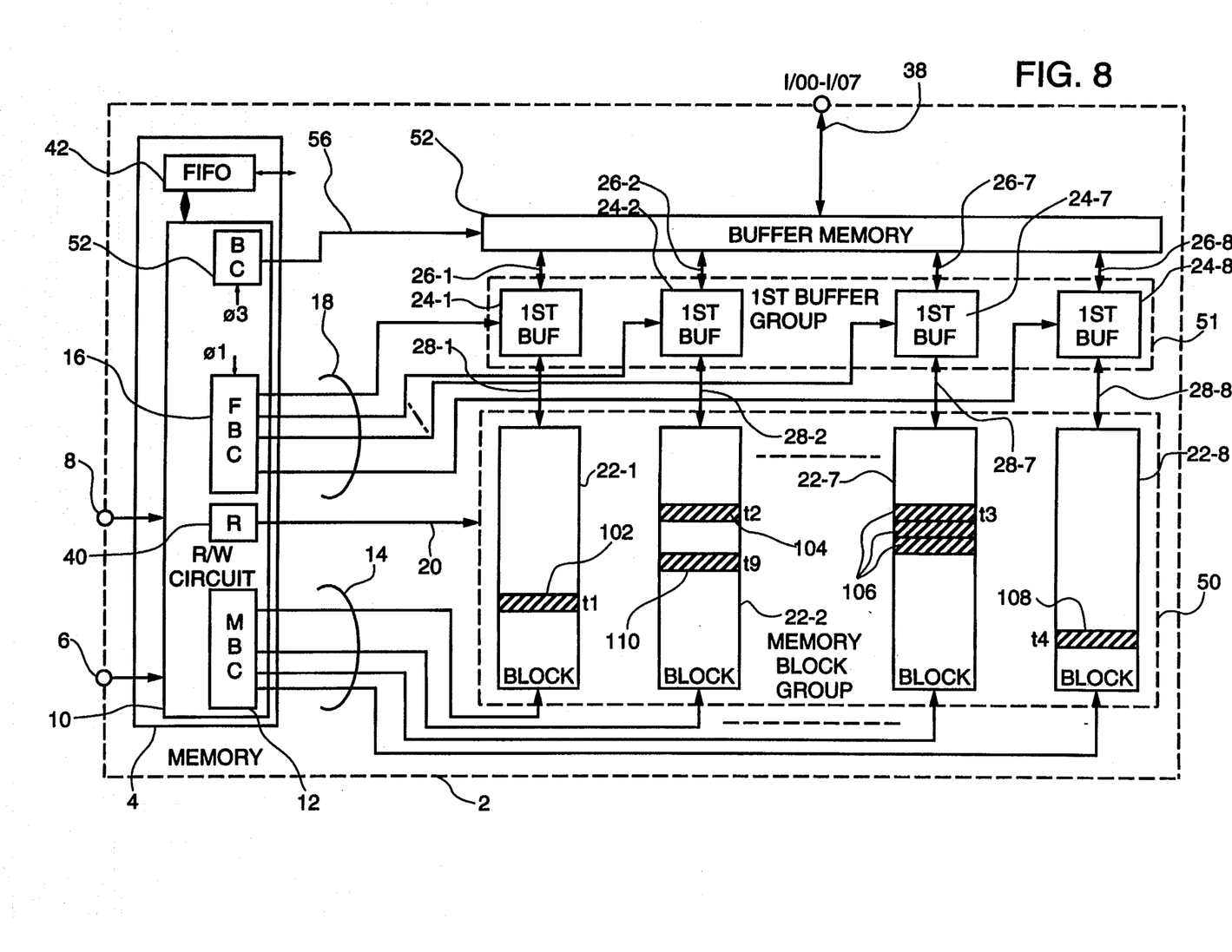
FIG. 8 is a block diagram for explaining the present invention.

In FIG. 8, the same portions as those of FIG. 1 are denoted by the same reference numerals and will not be described. A common buffer memory 52 is controlled by a control signal 56 from a control circuit 54, which is activated by signal $\phi 3$. The first buffer memories 24-1 to 24-8 hold the programming data for corresponding memory blocks 22-1 to 22-8 as a latch circuit until the non-volatile memory cells are completely rewritten. As shown in FIG. 8, the first buffer memories 24-1 to 24-8 are included in the same memory block group 50 together with the memory blocks 22-1 to 22-8. The common buffer memory 52 commonly serves the external I/O signal 38 and the I/O common buses 26-1 to 26-8, temporarily stores the read-out and programming data, and arbitrarily selects one of the memory blocks to rewrite the above-mentioned stored programming data in a predetermined sector. The first and common buffer memories constituted as mentioned above make it possible to increase the speed of transferring data.

With reference to FIG. 8 the rewrite-operation will be described below. The fundamental operation of this embodiment is the same as that of FIG. 1, and the shifted-timing selection and rewrite-operation described in the aforementioned embodiment are accomplished by arranging a plurality of address registers as register 40 that respectively temporarily hold the memory block start addresses, and by successively transferring the buffered data to the sectors of the memory blocks in a switched manner. Data is transferred from the buffer memory 52 to the first buffer memories 24-1 to 24-8, namely the data latch circuits, corresponding to the sectors in a time shorter than the time of program-operation of the memory cells of the sector. That is, when the program-operations of the sectors do not overlap with one another, the time taken to transfer the programming data to the buffers is about 10 $\mu$s/sector (=data transfer speed from the I/O signal 38 to the buffer memory 20 ns$\times$512 bytes) which is very much shorten than the programming time of 10 ms/sector. In this case, the data latch circuits provided in the non-volatile memory are used as the first buffer memories as described above, and they hold the data until the completion of rewrite-operation of the memory cells. The data latch circuits are used as the first buffer memories and the third buffer memory 52 has a small capacity equal to that of at least one sector, enabling the shifted-timing selection and rewrite to be carried out.

The timings of FIGS. 3, 4, 5, 6 may be considered as different embodiments or as software or hardware selectable modes of operation for a single device.

Moreover, the buffer memory functions as a cache memory during the reading and programming of the data, and therefore suppresses and decreases the rewrite frequency of the non-volatile memory. Moreover, the address of the sector from which the rewrite-operation is started is stored in the address register of the control unit as at least a sector address, and the flag bit added to the register representing the rewrite is written or updated depending upon the erasing or programming. After the rewrite, the flag bit is rewritten to represent that the rewrite is not necessary. Thus, the completion of the rewriting can be confirmed by judging the flag bit. The rewrite address basically needs to be temporarily stored during the period of rewrite processing, and can be stored in a volatile memory such as a DRAM or an SRAM. This makes it easy to constitute the circuit and to control the read/write circuit. The buffer memory can be either a DRAM or SRAM. When the power source is interrupted or when the cell level has dropped while the data is being transferred, the programming data is transferred again from the external unit. Here, if the sector start address and the like data are stored in a memory in which either the first or second buffer memory is constituted by a non-volatile memory or by a volatile memory which is backed up by a cell, the data can be self-programmed after the power source level is restored. Moreover, by making the flag bit non-volatile, it can be used as a programming protect signal.

The appearance/shape of the device and the method of storing information can be modified variously as necessary. The procedure of erasing and programming can be changed, and the whole or part of the procedure can be controlled by a unit outside the device. In this case, the information to the effect that the erasing or the programming is being executed is output to an external unit to facilitate the control operation. As for the memory device, there is no limitation in the number of I/O signals or in the number of sectors. Even with regard to the memory block which is a set of the sectors, the current increases by a very small amount when a plurality of sectors are selected compared with the case where the sectors among the memory blocks are selected. The present invention can be adapted even to the case where the memory block is divided into arrays (as sectors), and each of the divided memory arrays is rewritten and is read out like the memory block. The buffer memory is not limited to the one-port type memory but can be a multi-port type memory having serial ports and parallel ports. In this case, the device transfers the serial data at high speed and easily.

In the embodiment of the invention, a set of memory blocks is used as a device. At least two memories can be provided on the same semiconductor substrate in a memory chip having a large capacity, for example, in a memory device comprising circuits that control memory blocks, buffer memories and read/write circuits. Furthermore, it is evident that the invention can be adapted even to a logic-in memory, a semiconductor memory within a wafer scale integration constructed on a wafer, a memory device such as an optomagnetic disk in which the rewriting is effected with the sector as a unit and a memory cell is an undivided data unit of the disc, and a memory device of a combination thereof.

In this processing, it can be considered that the erasing and programming of the plural memory blocks overlap with each other simultaneously, i.e. they are parallel operations. However, the total current consumed by the device does not become excessively large because of the suppression by the external address input signal timing in accordance with the value of total current, a memory control signal, internal address control signals that are activated by input, and because of the shifted-timing selection for avoiding the overlap of the peak currents. Large current does not flow so that heat generation is suppressed, low noise level is maintained, and the reliability is improved.

A large capacity is realized at a low cost since it is possible to utilize a semiconductor memory that is a nonvolatile memory as if it were a DRAM which does not need a power source to hold data and whose price unit per bit is low.

While a preferred embodiment has been set forth with specific details, further embodiments, modifications and variations are contemplated according to the broader aspects of the present invention, all as determined by the spirit and scope of the following claims.

We claim:

1. A memory device, comprising:
    a plurality of memory blocks, each having a plurality of sectors, each sector having a memory capacity and including a plurality of memory cells;
    a plurality of buffer memories each connected to a respective one of said memory blocks to transfer data, and each buffer memory having a memory capacity at least the same as the memory capacity of a corresponding sector;
    a read/write circuit that is responsive to external address and timing signals to generate internal addresses and timing for selecting the sectors, and for thereby controlling read-out and rewrite of the data between selected sectors corresponding to the internal addresses and the buffer memories corresponding to the selected sectors; and
    said read/write circuit shifting the timings for selecting the selected sectors in response to current requirements of the memory device for controlling erasing and programming of the data in the selected sectors in order to perform rewrite of the data.

2. A memory device according to claim 1, wherein said read/write circuit selects the sectors at the timings shifted by arbitrary periods of time for the erasing of said sectors, and controls the internal addresses so that the programming of said sectors do not overlap with one another in regard to time.

3. A memory device according to claim 1, wherein said read/write circuit controls the internal addresses so that the erasings do not overlap with one another in regard to time.

4. A memory device according to claim 1, wherein said read/write circuit first controls the erasing of all sectors corresponding to the external address and thereafter controls the programming onto all of the corresponding sectors.

5. A memory device according to claim 1, wherein said read/write circuit selects arbitrary sectors of one memory block for programming, and inhibits the rewrite of other sectors of the one memory block.

6. A memory device according to claim 1, wherein said buffer memories temporarily store the data; and
    the read/write circuit supplies the data from outside the device through the buffer memories to the memory cells according to the erasing or programming.

7. A memory device according to claim 1, wherein said read/write circuit detects that a predetermined sector is being erased or being programmed in a memory block, programs other sectors in the memory block when the predetermined sector is being erased, and erases said other sectors when said predetermined sector is being programmed.

8. A memory device according to claim 1, wherein said read/write circuit is responsive to a first sector of one memory block being erased or being programmed to control sectors of other memory blocks to be programmed when said first sector is being erased and to be erased when said first sector is being programmed.

9. A memory device according to claim 1, wherein said read/write circuit has one address register storing the internal addresses being executed and another address register storing internal addresses to be executed.

10. A memory device according to claim 9, wherein said read/write circuit inhibits selection of sectors of the memory blocks other than the memory block having a predetermined sector that is selected during erasing or programming.

11. A memory device according to claim 10, wherein said one address register has at least one flag bit for distinguishing the internal address being executed from the internal address that is to be executed, and said read/write circuit is responsive to the flag bit to inhibit selection of sectors other than a current selected sector.

12. A memory device according to claim 9, wherein said one address register has at least one flag bit for distinguishing the internal address being executed from the internal address that is to be executed, and said read/write circuit is responsive to the flag bit to inhibit selection of sectors other than a current selected sector.

13. A memory device according to claim 1, wherein said buffer memories include a first buffer memory and a second buffer memory, and said read/write circuit controls said first buffer memory and said second buffer memory to transfer the data between said first buffer memory and said second buffer memory and simultaneously transfer the data between the selected sector and the first buffer memory or between another sector and the second buffer memory.

14. A memory device according to claim 13, wherein said read/write circuit is responsive to said first buffer memory transferring the data to the selected sector to control said second buffer memory to transfer data read out from other sectors of the same memory block to an external unit.

15. A memory device according to claim 13, wherein said read/write circuit is responsive to said first buffer memory transferring data to the selected sector to control said second buffer memory to transfer data read out from the sectors of other memory blocks to an external unit.

16. A memory device according to claim 13, wherein at least one of said first or second buffer memories is a non-volatile memory.

17. A memory device according to claim 1, wherein each of said buffer memories is a multi-port type memory having serial and parallel ports.

18. A memory device according to claim 1, wherein at least two of said memory blocks, two of said buffer memories and two of said read/write circuits are integrated on a single semiconductor substrate.

19. A memory device according to claim 1, wherein each of said buffer memories is one of an SRAM-type memory, a DRAM-type memory, or a combination of SRAM-type and DRAM-type memories.

* * * * *